US010424574B2

(12) United States Patent
Chu et al.

(10) Patent No.: US 10,424,574 B2
(45) Date of Patent: Sep. 24, 2019

(54) STANDARD CELL ARCHITECTURE WITH AT LEAST ONE GATE CONTACT OVER AN ACTIVE AREA

(71) Applicant: INTERNATIONAL BUSINESS MACHINES CORPORATION, Armonk, NY (US)

(72) Inventors: Albert M. Chu, Nashua, NH (US); Myung-Hee Na, Lagrangeville, NY (US); Ravikumar Ramachandran, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 15/412,608

(22) Filed: Jan. 23, 2017

(65) Prior Publication Data

US 2018/0211947 A1    Jul. 26, 2018

(51) Int. Cl.
*G06F 17/50* (2006.01)
*H01L 27/02* (2006.01)
*H01L 27/118* (2006.01)

(52) U.S. Cl.
CPC ...... *H01L 27/0207* (2013.01); *G06F 17/5072* (2013.01); *G06F 17/5077* (2013.01); *H01L 27/11807* (2013.01); *H01L 2027/11866* (2013.01)

(58) Field of Classification Search
USPC ................................. 716/118, 119, 126, 129
See application file for complete search history.

(56) References Cited

U.S. PATENT DOCUMENTS

| | | | |
|---|---|---|---|
| 6,394,638 B1 * | 5/2002 | Sengle | H01L 21/76224 |
| | | | 257/E21.546 |
| 6,867,465 B2 | 3/2005 | Dono | |
| 7,137,092 B2 | 11/2006 | Maeda | |
| 8,173,491 B2 | 5/2012 | Law et al. | |
| 8,759,181 B2 | 6/2014 | Jou et al. | |
| 8,901,615 B2 | 12/2014 | Moroz | |
| 9,263,457 B2 * | 2/2016 | Sardesai | H01L 29/66545 |
| 9,397,049 B1 * | 7/2016 | Fan | H01L 21/76897 |
| 2004/0238919 A1 * | 12/2004 | Brintzinger | H01L 23/5252 |
| | | | 257/530 |
| 2005/0045916 A1 | 3/2005 | Kim | |
| 2010/0011327 A1 * | 1/2010 | Becker | H01L 27/0207 |
| | | | 716/118 |

(Continued)

OTHER PUBLICATIONS

OrCAD Layout User's Guide, Product version 10.5, Jul. 2005.*
Office Action with cited art in corresponding U.S. Appl. No. 15/802,956 dated Nov. 29, 2018.

*Primary Examiner* — Brian Ngo
(74) *Attorney, Agent, or Firm* — Tutunjian & Bitetto, P.C.; Vazken Alexanian

(57) ABSTRACT

A method is presented for forming a layout of a MOSFET (metal oxide semiconductor field effect transistor) circuit. The method includes forming a plurality of gate conductors, forming a plurality of active areas, and forming at least one gate contact (CB contact) within an active region of the plurality of active regions. The method further includes placing a marker over the at least one gate contact to identify a location of the at least one gate contact. Additionally, a distance between the at least one gate contact and at least one TS contact is optimized based on device specifications.

13 Claims, 6 Drawing Sheets

(56) References Cited

U.S. PATENT DOCUMENTS

| | | | |
|---|---|---|---|
| 2010/0167513 A1* | 7/2010 | Blatchford | G03F 7/70633 |
| | | | 438/586 |
| 2014/0291731 A1* | 10/2014 | Becker | H01L 27/11807 |
| | | | 257/206 |
| 2015/0048424 A1 | 2/2015 | Tien et al. | |
| 2016/0141274 A1 | 5/2016 | Or-Bach et al. | |
| 2017/0186845 A1* | 6/2017 | Abou-Khalil | H01L 29/42376 |
| 2017/0213821 A1 | 7/2017 | Or-Bach et al. | |
| 2017/0278753 A1* | 9/2017 | Fan | H01L 21/76897 |
| 2017/0372959 A1* | 12/2017 | Fan | H01L 21/76897 |

* cited by examiner

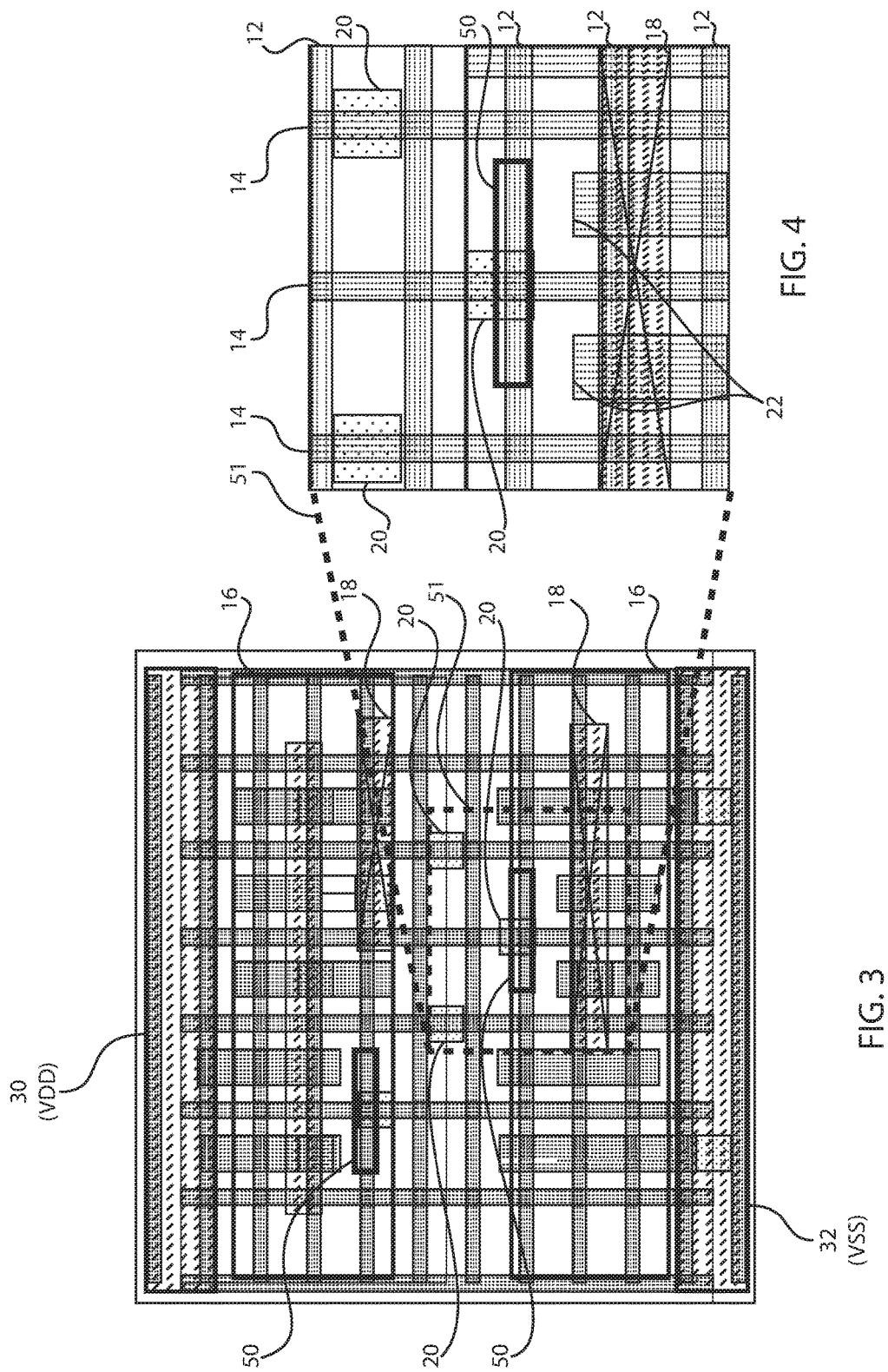

STANDARD CELL ARCHITECTURE WITH AT LEAST ONE GATE CONTACT OVER AN ACTIVE AREA

BACKGROUND

Technical Field

The present invention relates generally to semiconductor devices, and more specifically, to structures and methods of fabricating semiconductor devices using standard semiconductor cell fabrication.

Description of the Related Art

Standard semiconductor cell fabrication is a method for designing integrated circuits (ICs) for specific applications. Circuits are designed based on the desired functions using cells from a cell library, which are combined and constructed by a placement tool to result in the desired circuits. Standard semiconductor cell library performance is limited by the current a transistor of a cell can deliver. This is proportional to the width of the transistor. Thus, it is desirable to enable the transistor to be as wide as possible in a standard cell to deliver high performance circuits.

Standard cell methodology is a technique of designing ICs with a focus on the logic functions used in the IC. A standard cell includes multiple transistors that are interconnected to implement desired logic functions, such as AND, OR, NOT, XOR, and XNOR, as well as storage functions (e.g., flip-flops, latches, and buffers).

As semiconductor processes advance, device sizes continue to decrease. Present semiconductor production includes 14 nanometer and soon 7 nanometer minimum feature sizes. These process milestones are usually referred to as "technology nodes". Advances towards 7 nanometer node mass production are underway and expected shortly. The trend to smaller devices and more advanced nodes will no doubt continue.

As the transistor sizes shrink commensurate with the advances in the technology nodes, the device characteristics and performance become dominated by physical layout effects. The devices also exhibit wide performance differences due to semiconductor process variations. Robust designs must anticipate these effects.

In order to control the device process variation sensitivity, semiconductor manufacturers can use a restricted design rule approach ("RDR"). By restricting where certain layers can be formed with respect to the cell boundaries and with respect to the other layers, the process variation sensitivity issue can be reduced. However, this approach produces additional disadvantages. If horizontal polysilicon routing is not available to the routing process, for example, a layer of metal, typically metal layer 2 must be used to connect internal devices together to form a simple function within a cell. This known prior art approach increases the parasitic coupling significantly, thereby slowing down circuit performance. Generally, an area penalty is created when RDR approaches are used. The amount of silicon needed to implement the cells increases as the design rules are restricted.

This additional metal 2 (M2 layer) routing within the cells also adversely uses most of the available metal 2 (M2 layer) connectivity resources. Further, because the base cells now include the M2 layer, a routing congestion issue can occur when trying to route inter-cell connection signals, or power, clock or ground signals, over the cells. The result is a larger (less dense) layout requiring additional silicon area, or requiring the use of additional metal layers to resolve the congestion problems. These solutions to congestion in the cells add to manufacturing costs.

SUMMARY

In accordance with an embodiment, a method is provided for forming a layout of a MOSFET circuit, such as a standard cell. The method includes forming a plurality of gate conductors, forming a plurality of active areas, and forming at least one gate contact (CB contact) within an active region of the plurality of active regions.

In accordance with another embodiment, a layout of a MOSFET circuit, such as a standard cell is provided. The layout of the standard cell includes a plurality of gate conductors, a plurality of active areas, and at least one gate contact (CB contact) formed within an active region of the plurality of active regions.

The advantages include leveraging gate contacts over active regions to reduce a number of metal layers used while improving pin access and supporting a shortened cell height. Additional advantages include maximizing effective device width (i.e., number of fins) to improve device performance (i.e., by having more active fins). Further advantages include introducing AUXFIN to enable gate contacts over the active regions to minimize the process and yield risks. Further advantages include eliminating the M0 metal layer and accomplishing global wiring by using only the M1 metal layer (instead of the M2 layer). Therefore, manufacturing costs can be reduced by, e.g., simplifying cell connectivity schemes.

In one preferred aspect, a marker is placed over the at least one gate contact to identify a location of the at least one gate contact.

In another preferred aspect, the marker is placed over a portion of the at least one gate contact and the marker extends beyond a length of the at least one gate contact.

In yet another preferred aspect, at least one trench silicide (TS) contact is pulled back from the at least one gate contact.

In yet another preferred aspect, a distance between the at least one gate contact and at least one TS contact is optimized based on device specifications.

In yet another preferred aspect, a metal-zero (M0) layer is not present above the plurality of active regions.

In yet another preferred aspect, an M1 layer is positioned directly above the at least one gate contact, which in turn, is formed within the active region of the plurality of active regions.

In yet another preferred aspect, global wiring is performed on the M1 layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 3 is a layout view of the standard cell of FIG. 2 illustrating markers formed over the CB contacts, in accordance with an embodiment of the present invention;

FIG. 4 is an enlarged view of a marker formed over a CB contact, in accordance with an embodiment of the present invention;

Throughout the drawings, same or similar reference numerals represent the same or similar elements.

DETAILED DESCRIPTION

Figure 1:
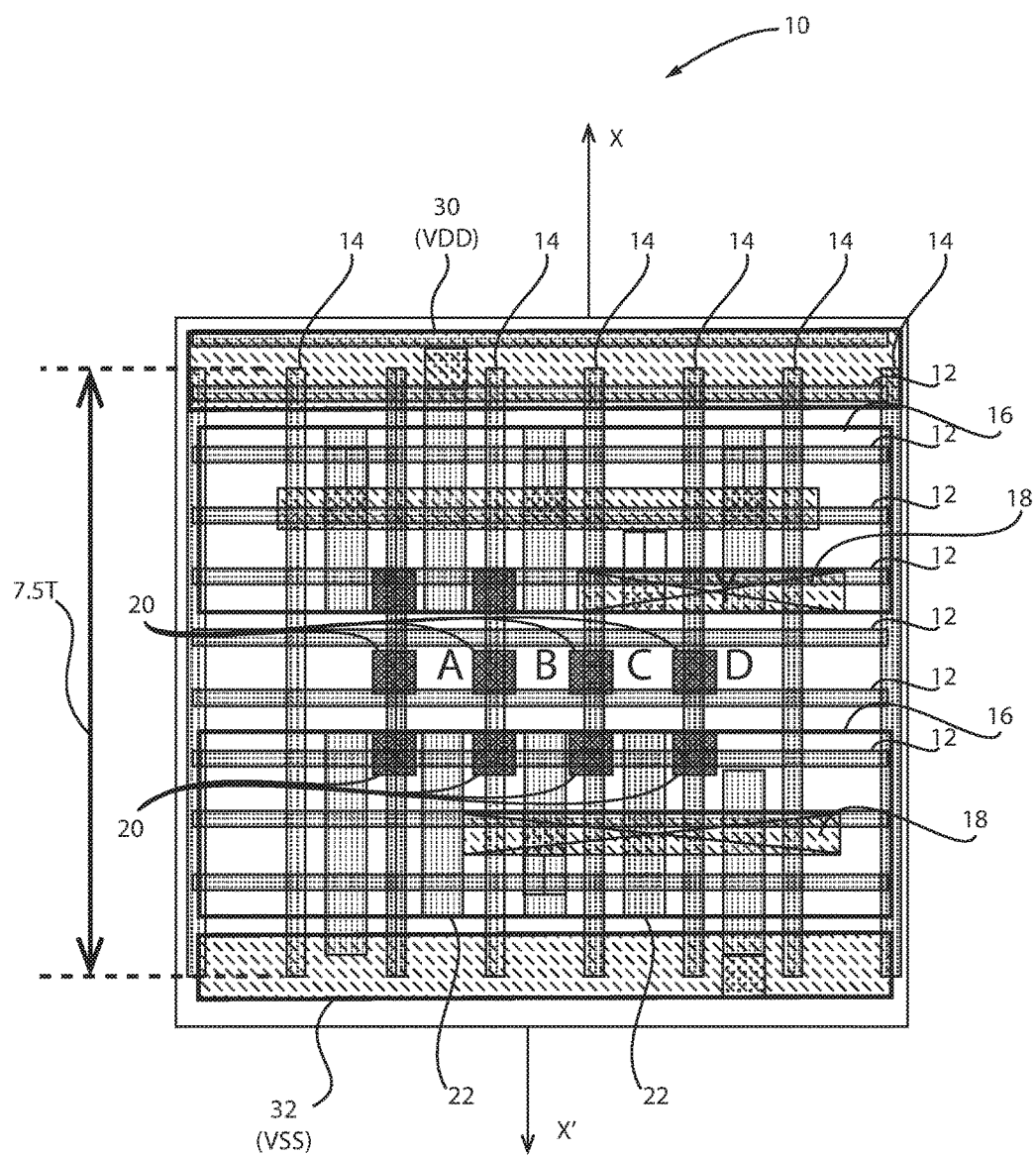
FIG. 1 is a layout view of a standard cell illustrating at least one gate contact (CB contacts) over active regions (RX), in accordance with an embodiment of the present invention.

In accordance with an embodiment, a method is provided for forming a layout of a standard cell. The method includes forming a plurality of gate conductors, forming a plurality of active areas, and forming at least one gate contact (CB contact) within an active region of the plurality of active regions.

In accordance with another embodiment, a layout of a standard cell is provided. The layout of the standard cell includes a plurality of gate conductors, a plurality of active areas, and at least one gate contact (CB contact) formed within an active region of the plurality of active regions.

In one or more embodiments, a new and useful logic standard cell architecture is presented that advantageously leverages gate contacts over active regions to reduce the number of metals used while improving pin access. In addition, effective device width (i.e., number of fins) can be maximized to improve performance. AUXFIN is also introduced as a complete and useful design solution to enable cost-effective CB contact over active layer design to minimize the process and yield risks.

In one or more embodiments, modifications to the on-wafer design and/or compact model are performed to advantageously adjust for the proximity of the CB-over-active structure. Two such modifications are an exclusion distance of TS to the CB, and provision for a modified compact model to represent the altered capacitance and resistance. The introduction of a marker layer is useful in such modifications.

Standard cells generally include functional cells and engineering change order (ECO) cells. A functional cell is pre-designed to have a specific function, e.g., a logic function. An ECO cell is pre-designed without a specific function, but is programmable to provide a specific function. To design an IC, the pre-designed layouts of one or more functional cells are read out from the standard cell libraries and placed into an initial IC layout. Routing is performed to connect the functional cells using one or more metal layers. The IC layout also includes one or more ECO cells which are not connected to the functional cells. When the IC layout is to be revised, one or more ECO cells are programmed to provide an intended function and routed to the functional cells. The programming of the ECO cells involves modifications in several layers of the IC layout and/or masks for manufacturing the IC.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE).

Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a layout view of a standard cell illustrating at least one gate contact (CB contacts) over active regions (RX), in accordance with an embodiment of the present invention.

During front end-of-the-line processing, a plurality of semiconductor devices (e.g., transistors, resistors, capacitors, and the like) are formed on a semiconductor wafer. The semiconductor devices are then locally interconnected during middle-of-the-line (MEOL) processing to produce an integrated circuit, such as a logic circuit or a memory cell. To enable the local interconnection of the semiconductor devices during MEOL processing, device-level plugs are formed in ohmic contact with the electrically-active areas of the substrate (commonly designated as "RX") and the gate conductors (commonly designated as "PC"), and local interconnect lines are formed in ohmic contact with the device-level plugs. In many cases, such as in certain replacement gate-based processes, the local interconnect lines and device-level plugs can be divided into three general categories: (i) trench-with-late-silicide contacts (referred to herein as "TS contacts") in ohmic contact with RX; (ii) local interconnect lines (referred to herein as "CA contacts") in ohmic contact with the TS contacts; and (iii) plugs in ohmic contact with PC (referred to herein as "CB contacts"). The TS, CA, and CB contacts are collectively referred to herein as the "local contacts." The local contacts can also include shared TS/CB contacts, which provide an electrically-bridged connection to both RX and PC. After formation of the local contacts, the fabrication process advances to back end-of-the-line (BEOL) processing during which additional BEOL layers are formed to globally interconnect the integrated circuits, which are subsequently separated into individual die during wafer dicing.

From one circuit generation or node to the next, critical dimensions are continually reduced and pattern densities are continually increased. To enable the production of highly dense circuit layouts, MEOL patterning processes have been developed wherein multiple masks are utilized to pattern the dielectric layers deposited over the semiconductor devices (e.g., the pre-metal dielectric layer and the overlying inter-metal dielectric layer), which are subsequently filled with metal and polished to produce the local contacts. The CA contacts can thus be printed with a first mask and a first illumination source, while the CB contacts are printed with a second mask and a second illumination source. To achieve an extremely fine resolution, the CA contacts can be printed to have a unidirectional orientation; that is, the CA contacts can be printed as small trench-like structures, which are elongated along the maximum axis of the circuit layout, but extremely narrow along the minimum axis. The CB contacts, however, are typically not so constrained and can be printed to have a bidirectional orientation; that is, the CB contacts can extend along both the maximum and minimum axes of the circuit layout.

In densely-patterned circuits, such as SRAM cells included within semiconductor nodes equal to or less than 20 nm, geometry-driven design rules can exclude the usage of copper in the metallization of contact levels containing non-unidirectional local contacts. In the case of conventionally-produced circuits, the bidirectional CB contacts typically extend downward through the local interconnect level in which the CA contacts are formed and into an upper portion of the device-contact level in which the TS contacts are formed.

Standard cell methodology is a technique of designing ICs with a focus on the logic functions used in the IC. A standard cell includes multiple transistors that are interconnected to implement desired logic functions, such as AND, OR, NOT, XOR, and XNOR, as well as storage functions (e.g., flip-flops, latches, and buffers).

A standard cell library includes various standard cells having predetermined heights and widths. The standard cell library can include multiple standard cells for a single logic function that differ in area, speed, and power consumption. Designers can select the desired standard cells from the standard cell library based on the area, speed, and power consumption requirements of the IC and arrange the standard cells in rows and columns. Once a schematic view (a view that illustrates the terminals of the multiple transistors and the interconnections thereof) of the IC is generated by the design tool, the IC design is simulated, a layout view (a view that illustrates the actual physical implementation of the standard cells) of the IC design is generated and verified before fabrication of the IC. The cost of production of the IC is directly proportional to its layout area.

Referring back to FIG. 1, the schematic layout 10 depicts a plurality of fins 12 extending horizontally thereof. The plurality of fins 12 are perpendicular to the gate conductors 14. The gate conductors 14 are parallel to a longitudinal axis X-X' extending through the layout 10. Active regions 16 are formed over portions of the plurality of fins 12 and the plurality of gate conductors 14. In one example, two active regions 16 are illustrated.

M1 pins 18 are further shown over active regions 16. Additionally, CB contacts or gate contacts 20 are shown. A number of gate contacts 20 are placed over the first active region 16 and a number of gate contacts 20 are placed over the second active region 16. The placement of the gate contacts 20 over the active region 16 has the advantage of eliminating the M0 metal layer and performing global wiring at the M1 metal layer. The placement of the gate contacts 20 over the active region 16 is also useful for reducing manufacturing costs by simplifying cell connectivity.

In one or more embodiments, the gate contacts 20 can be of a material such as polysilicon or amorphous silicon, or the gate contacts 20 can be comprised of one or more metal layers that act as the gate electrode. As will be recognized by those skilled in the art, the gate structures 20 of the transistor devices depicted in the drawings, i.e., are intended to be representative in nature. That is, the gate structures 20 can be comprised of a variety of different materials and can have a variety of configurations, and the gate structures 20 can be made using either the so-called "gate-first" or "replacement gate" techniques.

In one or more embodiments, trench silicide (TS) contacts 22 are formed between the gate conductors 14. The TS contacts 22 are pulled back from the CB contacts 20. Stated differently, the TS contacts 22 are offset from the CB contacts 20, which has the advantage of eliminating the M0 metal layer and allowing global wiring to occur at the M1 metal layer, as described below.

In some embodiments, a first conductive pattern, such as a power line (VDD) 30, is provided, and a second conductive pattern, such as a ground line (VSS) 32, is provided for supplying power and ground voltages to a cell when the cell is programmed.

In conventional standard cell layouts, conductive patterns are formed of metal and belong to a first metal layer, referred to herein as "M0 layer," i.e., metal-zero (M0) layer, which is usually the lowermost metal layer above the active devices of the cell. However, in the exemplary embodiments of the present invention there is no M0 layer. Instead, global wiring occurs at the M1 layer. This has the advantage of reducing manufacturing costs.

A second metal layer is a metal layer immediately above the M0 layer, and is referred to herein as "M1 layer" or "Metal 1 layer," and is schematically illustrated in the drawings with the label "Metal 1" or "M1." The M1 layer will be described below with reference to FIG. 2.

In some embodiments, active area patterns 16 are configured to define active devices in the cell. Examples of active devices include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or FinFETs, planar MOS transistors with raised source/drains.

In older technologies, the CA and CB contacts were typically formed at the same time. However, as device dimensions and gate pitch dimensions decreased, the formation of self-aligned contacts has become necessary so as to avoid creating an electrical short between the CA contact and the gate structure. Typically, the gate structure is fully encapsulated by a silicon nitride cap layer and a silicon nitride sidewall spacer. A layer of insulating material, such as silicon dioxide, is formed on the substrate adjacent the gate structure and above the source/drain regions.

To form the opening for the self-aligned source/drain contact structure (CA), an RIE process is typically performed to remove the silicon dioxide material selectively relative to the silicon nitride materials that encapsulate the gate structure. Since formation of the contact opening for the gate contact (CB) necessarily had to involve etching through the silicon nitride gate cap layer, the formation of the CA contacts and the CB contact could not be performed at the same time. That is, performing a common CA/CB etching process with an etchant that would remove portions of the silicon nitride gate cap layer (so as to form the CB contact opening) would consume the protective silicon nitride sidewall spacers and the silicon nitride gate cap layer adjacent the contact openings for the CA contacts, thereby exposing the gate structure to the CA contact openings.

Figure 2:
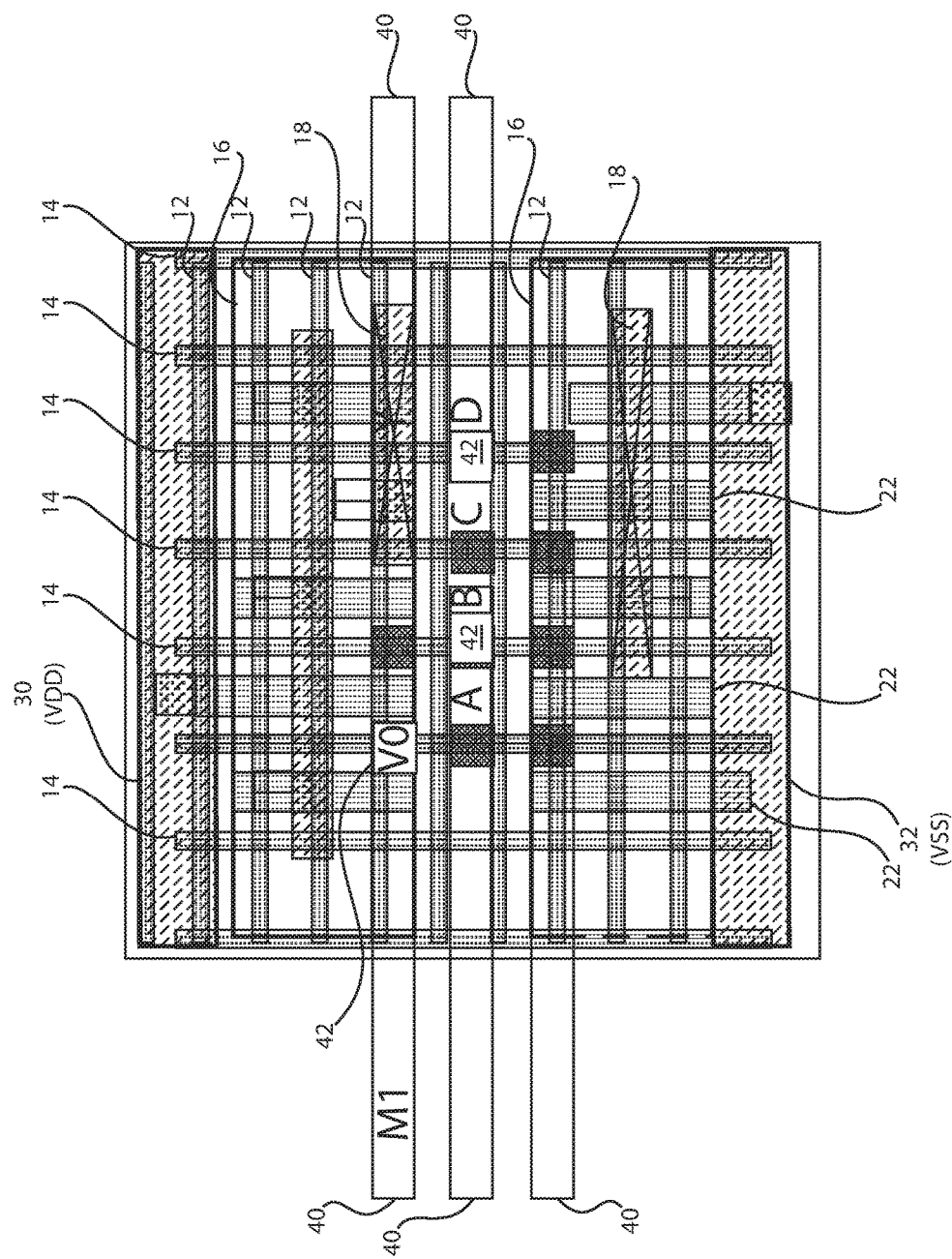
FIG. 2 is a layout view of the standard cell of FIG. 1 illustrating metal layer M1 and vias V0 formed over the CB contacts, in accordance with an embodiment of the present invention.

FIG. 2 is a layout view of the standard cell of FIG. 1 illustrating metal layer M1 and vias V0 formed over the CB contacts, in accordance with an embodiment of the present invention.

In various embodiments, a metal layer 40 (or M1) is deposited over a number of CB contacts 20. Vias 42 are then formed over the section where the CB contact 20 and the metal layer 40 overlap. The CB contacts 20 are formed over portions of gate conductors 14. Stated differently, the vias 42 are aligned with the CB contacts 20, which are aligned with sections or portions of the gate conductors 14.

By way of example only, blanket metallization techniques can be employed to apply metal layer 40. Specifically, metal layer 40 can be applied by blanket metallizing all exposed surfaces by electroplating to a sufficient thickness of, for example, copper. The electroplating is preferably followed by the application of a photoresist and the subsequent exposure of the photoresist, e.g., by light, through a photomask. The photoresist is developed, exposing the areas desired to be etched away.

In various embodiments, the TS contacts 22 are metallized by depositing a metal layer (not shown). Such metal layer preferably comprises any metal suitable for effectively conducting electricity, including, but not limited to, copper, gold, nickel-titanium alloy and combinations comprising at least one of the foregoing metals. Metallization can be performed by any suitable metal deposition technique, including, but not limited to, sputtering, evaporating, electroplating, electroless plating and combinations comprising at least one of the foregoing metal deposition techniques.

FIG. 3 is a layout view of the standard cell of FIG. 2 illustrating markers formed over the CB contacts, in accordance with an embodiment of the present invention, whereas FIG. 4 is an enlarged view of a marker formed over a CB contact, in accordance with an embodiment of the present invention.

In various embodiments, a marker 50 can be positioned over a portion of a CB contact 20. The marker 50 can extend along a length of the CB contact 20. In one example, the marker 50 is placed over a portion of the at least one gate contact 20. In another example, the marker 50 extends beyond a length of the at least one gate contact 20. In another example, the marker 50 does not cover the entire surface of the CB contact 20. The TS contacts 22 are shown pulled back from the CB contacts 20. The highlighted region 51 emphasizes the relationship between the marker 50 and the CB contact 20.

Moreover, AUXFIN is introduced to advantageously identify the location of CB contacts 20 over or within an active area 16. The useful purpose of AUXFIN is to (i) provide process robustness, (ii) a performance-aware design, and (iii) alternative design options. Process robustness provides for TS pull back that can be enabled to guarantee improved margins of the TS and CB process window. Regarding performance aware-design, due to TS pull-back on an active FIN area, resistance and capacitance trade-off of the fins will be present. Using the AUXFIN concept, this specific area is modeled separately by using layout-effect modeling. Moreover, regarding alternative design options, AUXFIN can enable the design community with alternate design options depending on circuit functionality.

Figure 5:
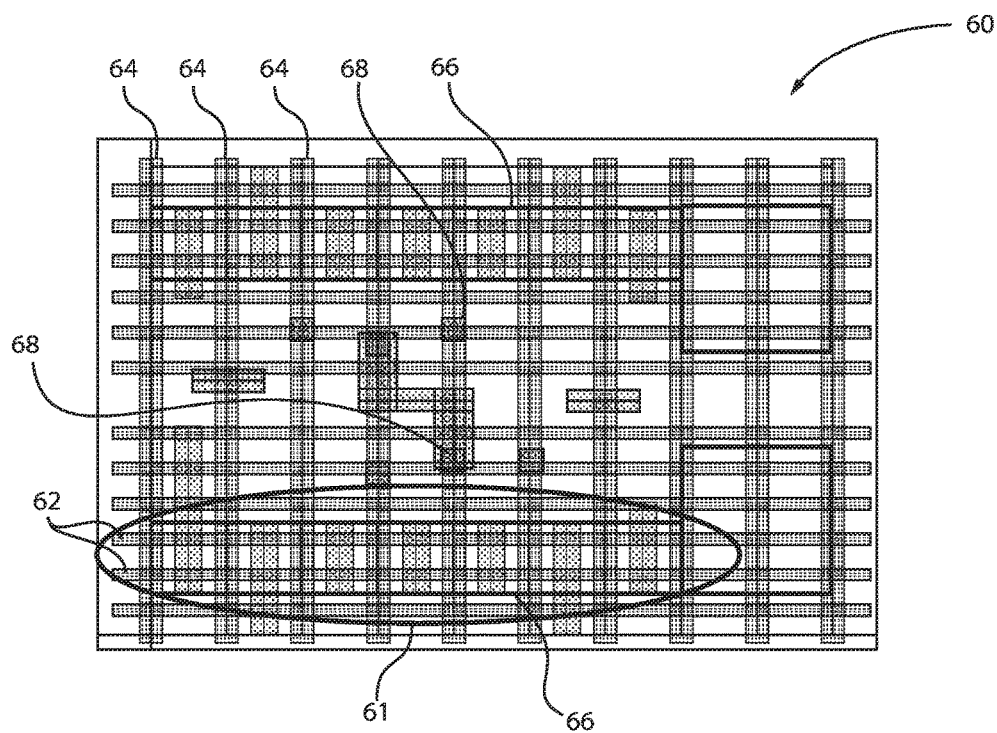
FIG. 5 is a layout view of the standard cell illustrating two fins using CB contacts over an active region, in accordance with an embodiment of the present invention.

FIG. 5 is a layout view of the standard cell illustrating two fins using CB contacts over an active region, in accordance with an embodiment of the present invention.

The schematic layout 60 depicts a plurality of fins 62, a plurality of gate conductors 64, and active regions 66. A plurality of CB contacts 68 are positioned over non-active regions. The highlighted section 61 illustrates two fins 62 aligned with the active region 66.

Figure 6:
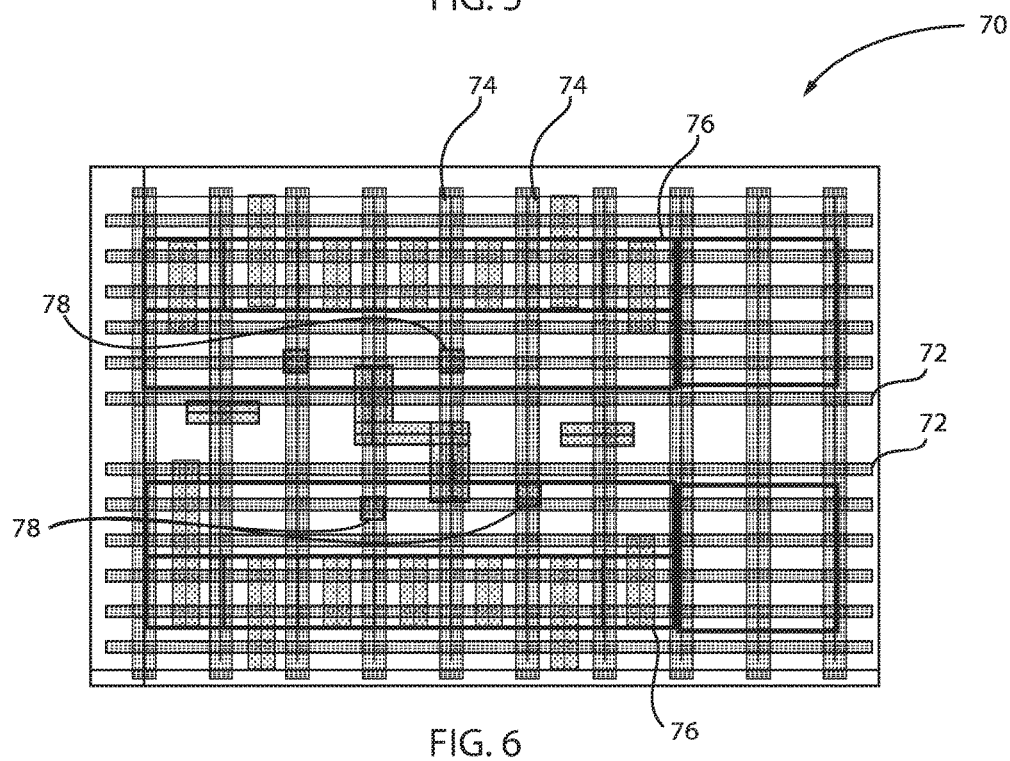
FIG. 6 is a layout view of the standard cell illustrating four fins using CB contacts over an active region, in accordance with an embodiment of the present invention.

FIG. 6 is a layout view of the standard cell illustrating four fins using CB contacts over an active region, in accordance with an embodiment of the present invention.

The schematic layout 70 depicts a plurality of fins 72, a plurality of gate conductors 74, and active regions 76. A plurality of CB contacts 78 are positioned over active regions 76. FIG. 6 illustrates four fins 72 aligned with each of the active regions 76. Thus, higher performance advantages are obtained by having more active fins. The more active fins, the better and faster the semiconductor devices can perform. Therefore, it is useful to expand the active regions to accommodate more fins.

Figure 7:
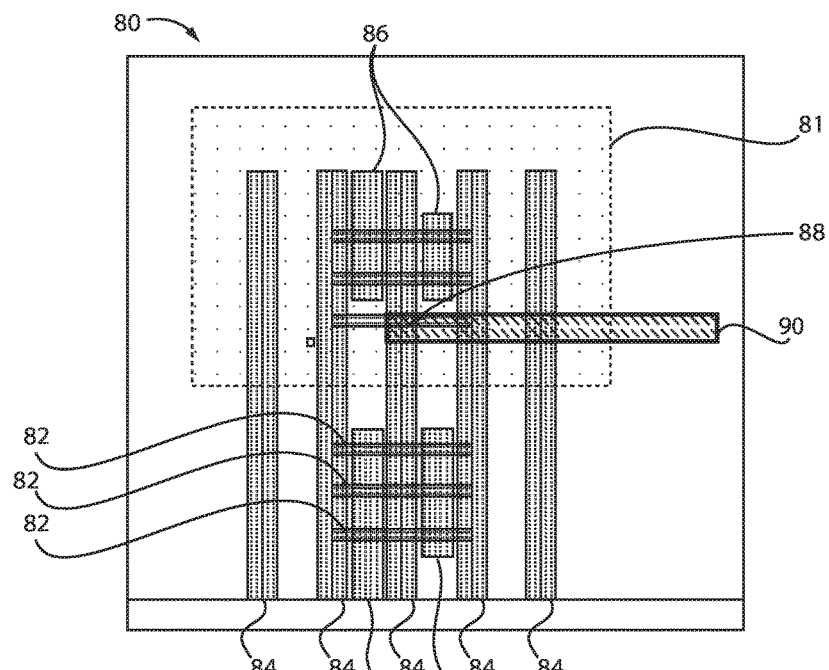
FIG. 7 is a layout view of the standard cell illustrating trench silicide (TS) pull back, in accordance with an embodiment of the present invention.

FIG. 7 is a layout view of the standard cell illustrating trench silicide (TS) pull back, in accordance with an embodiment of the present invention.

The schematic layout 80 depicts a plurality of fins 82, a plurality of gate conductors 84, and a plurality of TS contacts 86. A CB contact 88 is shown positioned over a gate conductor 84 and within an active region 81. The plurality of fins 82 extend horizontally along the layout 80, whereas the plurality of gate conductors 84 vertically along the layout 80. The TS contacts 86 are positioned or placed between the gate conductors 84. A metal layer 90 is placed over the CB contact 88. The metal layer 90 is perpendicular to the gate conductors 84.

Figure 8:
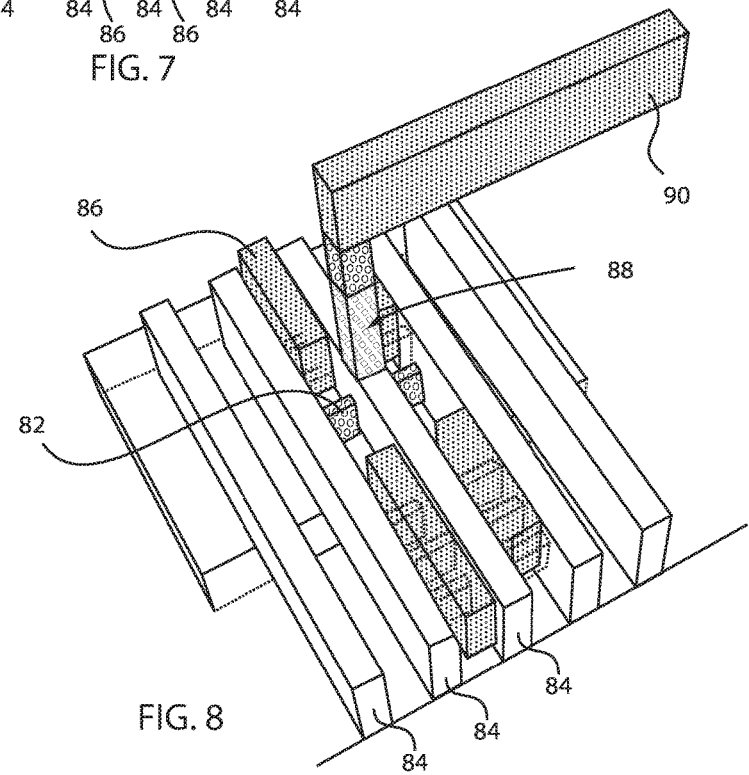
FIG. 8 is perspective view of the standard cell of FIG. 7 illustrating TS pull back, in accordance with an embodiment of the present invention.

FIG. 8 is perspective view of the standard cell of FIG. 7 illustrating TS pull back, in accordance with an embodiment of the present invention.

In various aspects, TS pull back is shown. For example, a TS contact 86 is placed or formed between a pair of gate conductors 84. Both the TS contact 86 and the gate conductors 84 are formed over a plurality of fins 82. The CB contact 88 is formed over one of the gate conductors 84 such that it is offset from the TS contacts 86. Stated differently, the TS contact 86 is pulled back from the CB contact 88.

Figure 9:
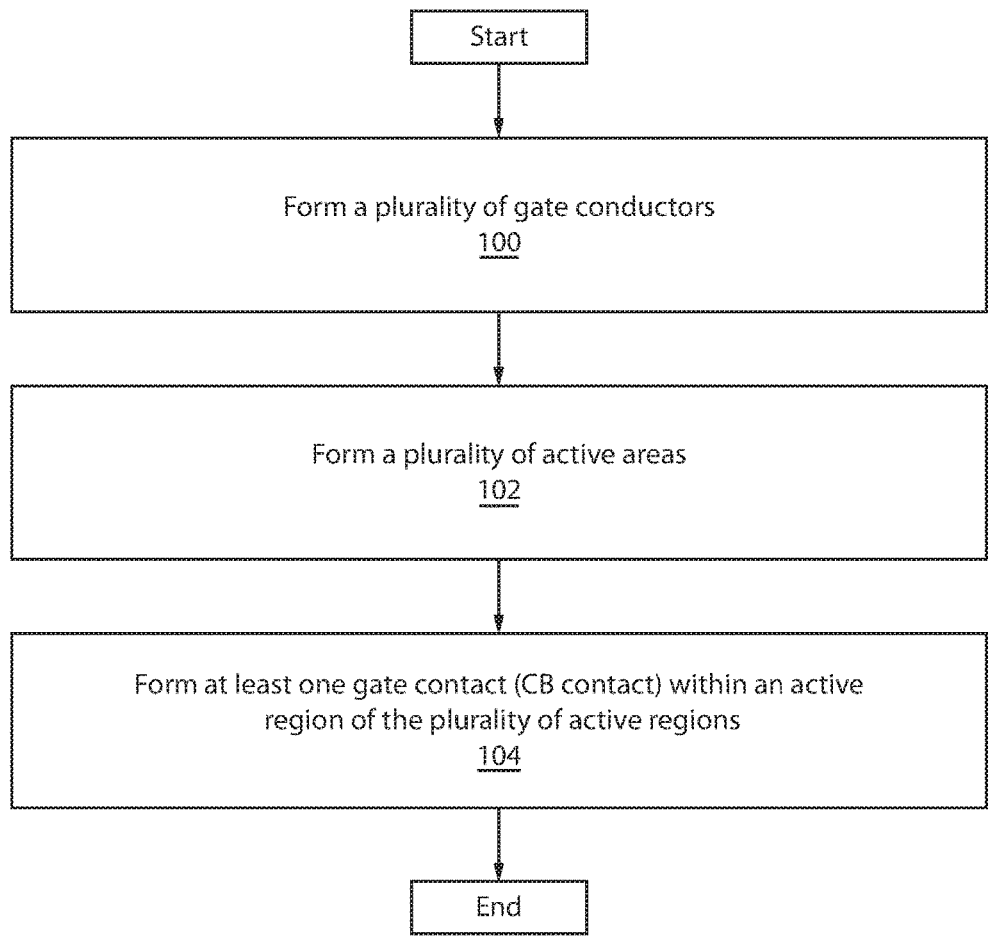
FIG. 9 is a block/flow diagram of an exemplary method for forming a layout of a standard cell, in accordance with an embodiment of the present invention.

FIG. 9 is a block/flow diagram of an exemplary method for forming a layout of a standard cell, in accordance with an embodiment of the present invention.

At block 100, a plurality of gate conductors are formed.
At block 102, a plurality of active areas are formed.
At block 104, at least one gate contact (CB contact) is formed within an active region of the plurality of active regions.

In conclusion, system level designers who determine a need for a newly defined integrated circuit, for example to integrate a variety of functions into one chip, often use an application specific integrated circuit (ASIC) or system on a chip (SOC) cell based design. In this approach, a library of known functions is provided, and after the functional design of the device is specified by choosing and connecting these standard functions, and proper operation of the resulting circuit is verified using electronic design automation (EDA) tools, the library elements are mapped on to predefined layout cells which contain prefigured elements such as transistors. The cells are chosen with the particular semiconductor process features and parameters in mind and create a process parameterized physical representation of the design. The design flow continues from that point by performing placement and routing of the local and global connections needed to form the completed design using the standard cells. The example embodiments of the present invention describe the advantages of using global wiring connections only on the M1 layer (instead of the M2 layer) and the exclusion of a M0 layer. Additionally, the example embodiments of the present invention describe the advantages of forming CB contacts such that they are offset from the TS contacts. Thus, the CB contact is formed over an active region. As a result, the number of metal layers is reduced (i.e., the elimination of layer M0) and shortened cell height is advantageously supported. Moreover, higher performance advantages are obtained by having more active fins.

Further, after design rule checks, design rule verification, timing analysis, critical path analysis, static and dynamic power analysis, and final modifications to the design, a "tape out" step is formed to produce photomask generation data. This photomask generation data (PG) is then used to create the optical masks used to fabricate the semiconductor device in a photolithographic process at a wafer fabrication facility.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing parasitic back gate capacitance (which are intended to be illustrative and not limiting), it is noted that modifications and variations can be made by persons skilled in the art in light of the above teachings. It is therefore to be understood that changes can be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A layout of a MOSFET (metal oxide semiconductor field effect transistor) circuit including a plurality of metal layers {M1, M2 . . . Mn}, comprising:
    a plurality of gate conductors;
    a plurality of active areas;
    at least one gate contact formed within each active region of the plurality of active regions; and
    a marker placed over the at least one gate contact to identify a location of the at least one gate contact;
    wherein an M0 layer is excluded from the layout such that global wiring occurs at the M1 layer in the layout; and
    wherein the exclusion of the M0 layer modifies a width of the MOSFET circuit to accommodate more active fins.

2. The layout of claim 1, wherein the marker is placed over a portion of the at least one gate contact.

3. The layout of claim 1, wherein the marker extends beyond a length of the at least one gate contact.

4. The layout of claim 1, wherein at least one trench silicide (TS) contact is pulled back from the at least one gate contact.

5. The layout of claim 1, wherein a distance between the at least one gate contact and at least one TS contact is optimized based on device specifications.

6. The layout of claim 1, wherein the MOSFET circuit is a standard cell.

7. The layout of claim 1, wherein the M1 layer is positioned directly above the at least one gate contact, which in turn, is formed within the active region of the plurality of active regions.

8. The layout of claim 7, wherein pin access is accomplished at the M1 layer.

9. The layout of claim 7, wherein a via layer is formed over the at least one gate contact.

10. The layout of claim 1, wherein a power line and a ground line are provided to supply power and ground voltages, respectively, to the MOSFET circuit.

11. The layout of claim 10, wherein the power line and the ground line are metal lines.

12. The layout of claim 11, wherein the power line and the ground line are connected to the M1 layer.

13. The layout of claim 1, wherein the M1 layer is a unidirectional metal layer.

* * * * *